United States Patent [19]

Reichman et al.

[11] Patent Number: 4,511,838

[45] Date of Patent: Apr. 16, 1985

[54] METHOD FOR DETERMINING THE POINT OF ZERO ZETA POTENTIAL OF SEMICONDUCTOR

[75] Inventors: Benjamin Reichman, Birmingham, Mich.; Charles E. Byvik, Hampton, Va.

[73] Assignee: The United States of America as represented by the Administrator of the National Aeronautics and Space Administration, Washington, D.C.

[21] Appl. No.: 364,041

[22] Filed: Mar. 31, 1982

[51] Int. Cl.³ ............................................. G01N 27/02
[52] U.S. Cl. .................................... 324/71.5; 204/1 T; 324/158 D
[58] Field of Search .................... 204/1 T; 324/158 D, 324/158 R, 71.6, 71.5

[56] References Cited

U.S. PATENT DOCUMENTS

| 3,039,056 | 6/1962 | Many et al. | 324/158 |
|---|---|---|---|
| 3,208,919 | 9/1965 | Sennett et al. | 204/1 T |
| 3,658,672 | 4/1972 | Edward | 204/164 |
| 4,168,212 | 9/1979 | Faktor et al. | 204/1 T |

OTHER PUBLICATIONS

Willem Smit et al., J. Colloid & Interface Science, vol. 60, No. 2, pp. 299–307, Jun. 15, 1977.

E. Gileadi et al., "Interfacial Electrochemistry, an Experimental Approach", pp. 33, 237–262, (1975).

Primary Examiner—G. L. Kaplan
Attorney, Agent, or Firm—William H. King; Howard J. Osborn; John R. Manning

[57] ABSTRACT

A method for determining the potential of zero charge of an unpowdered semiconductor material. The semiconductor material is used as the working electrode 12 of a standard three-electrode photoelectrochemical cell 11. The onset potential of the semiconductor material is measured at several different cell temperatures. The slope of the graph of onset potential versus temperature is used to compute the potential of zero charge.

4 Claims, 2 Drawing Figures

METHOD FOR DETERMINING THE POINT OF ZERO ZETA POTENTIAL OF SEMICONDUCTOR

ORIGIN OF THE INVENTION

The invention described herein was made in the performance of work under a NASA contract and is subject to the provisions of Section 305 of the National Aeronautics and Space Act of 1950, Public Law 85-568 (72 Stat. 435; 42 USC 2457.

BACKGROUND OF THE INVENTION

The invention relates generally to semiconducting materials and more specifically concerns a method for determining the point of zero zeta potential (pzzp), also known as the potential of zero charge (pzc) for an unpowdered semiconducting material.

In the past, two methods have been used to determine the pzc of semiconducting materials. Both methods require that the material be in powdered form. One method monitors the pH of a noncorrosive solution into which the powdered material is introduced. The pzc is determined at the point where no further change in solution pH is observed when additional powder is added. The other method involves the potentiometric addition of a known quantity of acid or base to a suspension of powdered material. From the observed changes in solution pH, the pH$_{pzc}$ can be calculated. A review of these methods and results can be found in *Oxides and Oxide Films*, vol. 2, J. W. Diggle, ed., Marcel Dekker, 1973, p. 281. The first method discussed above has been applied to determine the pH$_{pzc}$ of semiconductor electrodes used in photoelectrochemical cells and is discussed in Butler, M. A.; and Ginley, D. S.: *Journal of Electro-Chemical Society*, vol. 125, 1978, pp. 228 and 1968.

These methods require that samples of semiconductor materials be in the form of fine powder with a resulting large surface area capable of causing detectable changes in solution pH. This requirement results in the determination of the pH$_{pzc}$ of the material in a configuration in which it may not normally be utilized and also this value may not be correct for the material in unpowdered form.

The primary object of this invention is to provide a simple method that can be used to determine the pH$_{pzc}$ for nonpowdered semiconductor materials. Other objects and advantages of this invention will become apparent hereinafter in the specification and drawings.

SUMMARY OF THE INVENTION

The invention is a method for determining the pH$_{pzc}$ of a semiconductor material. The semiconductor material is used as the working electrode of a standard three-electrode photoelectrochemical cell. A high surface area platinum electrode is used as the counter-electrode. Data for obtaining a plot of the onset potential as a function of temperature is gathered by varying the temperature of the photoelectrochemical cell. At each temperature, the potential is varied between the working electrode and the counter-electrode until the photocurrent between these two electrodes is zero. Then the potential between the working electrode and the third electrode of the photoelectrochemical cell (the reference electrode) is measured. This potential is the onset potential. The slope of the onset potential versus temperature graph is used to determine the pH$_{pzc}$ of the semiconductor material.

DETAILED DESCRIPTION OF THE INVENTION

Figure 1:
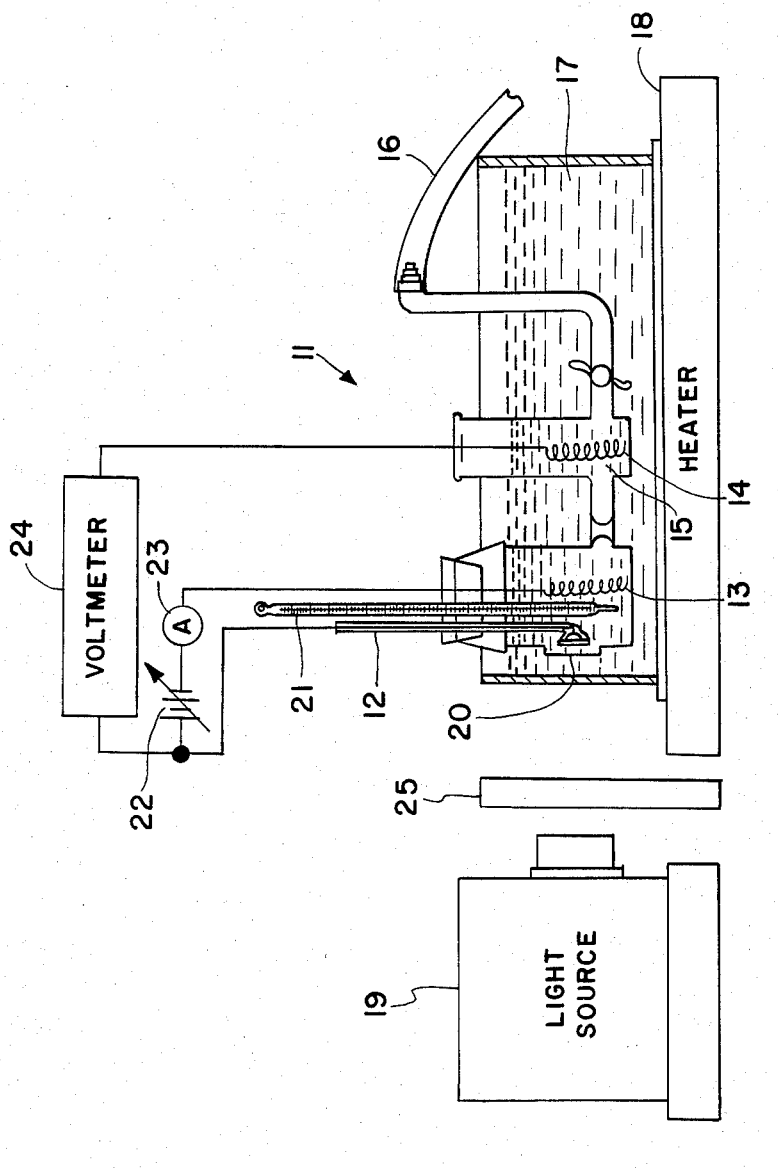
FIG. 1 is a schematic drawing of the apparatus used in the method of the invention.

One of the most important parameters in determining the energy conversion efficiency of a semiconductor photoelectrode used in a photoelectrochemical cell is its flatband potential (FBP). The FBP of the semiconductor electrode with respect to a reference electrode can be described by the following equation:

$$V_{FB} = EA - \Delta_{FC} - \Delta_{pH} - E_o \quad (1)$$

where EA is the electron affinity of the semiconductor (in volts), $\Delta_{FC}$ is the potential difference between the conduction band edge and the Fermi-level of the semiconductor, $\Delta_{pH}$ is the voltage drop across the Helmholtz layer, and $E_o$ is the potential of the reference electrode with respect to vacuum. In principle, the temperature change can affect the FBP ($V_{FB}$) with respect to a reference electrode by changing $\Delta_{FC}$, the Helmholtz layer ($\Delta_{pH}$) and the potential of the reference electrode with respect to vacuum ($E_o$). The potential difference between the conduction band and the Fermi-level for a nondegenerately doped n-type semiconductor is $$\Delta_{FC} = \frac{RT}{F} \ln \frac{n}{N_c} \quad (2)$$

where n is the free carrier density, $N_c$ is the density of states in the conduction band, F is Faraday's constant, R is the universal gas constant and T is temperature.

The voltage drop across the Helmholtz layer at oxide semiconductor surfaces can be written as $$\Delta_{pH} = \frac{2.3RT}{F} \log \frac{[H+]}{[H+]_{pzc}} = \frac{2.3RT}{F} (pH - pH_{pzc}) \quad (3)$$

where pH$_{pzc}$ is the pH of the solution at which the voltage drop across the Helmholtz layer is zero. When inserted into equation (1), $$V_{FB} = EA - \frac{RT}{F} \ln \frac{n}{N_c} - \frac{2.3RT}{F} (pH - pH_{pzc}) - E_o \quad (4)$$

Equation (4) shows the explicit dependence of the FBP on the potential drop in the Helmholtz layer as well as the well known dependence of the FBP on the pH of the solution. The dependence of $V_{FB}$ on the temperature is also expressed here. If a reference electrode which is reversible to hydrogen ions is chosen (e.g., H$_2$/H$^+$ or Hg/HgO), the FBP with respect to this electrode will in principle be independent of the pH since $$E_o = 4.5V - \frac{2.3RT}{F} pH$$

Then $$\frac{\delta V_{FB}}{\delta T} = \frac{2.3R}{F} \text{pH}_{pzc} - \frac{R}{F} \ln \frac{n}{N_c} \cong \quad (5)$$

$$\frac{2.3R}{F}\left[\text{pH}_{pzc} - \log_{10}\frac{n}{N_c}\right]$$

This equation predicts that the FBP of an oxide semiconductor electrode will shift linearly with increasing temperature to a more positive potential with a slope which is independent of the pH of the solution and which is determined by the magnitude of the $\text{pH}_{pzc}$. The more basic the electrode surface, the higher the $\text{pH}_{pzc}$, resulting in a larger change in the FBP with cell temperature.

Since R, F, n and $N_c$ are known for a particular semiconductor material, $\text{pH}_{pzc}$ can be calculated by the use of equation (5) if $$\frac{\partial V_{FB}}{\partial T}$$

can be determined.

$$\frac{\partial V_{FB}}{\partial T}$$

is determined in the present invention by plotting the change in onset potential ($V_{op}$) against temperature and determining the slope of the plot. Onset potential is the potential, with respect to a reversible hydrogen electrode (RHE) in a standard three-electrode photoelectrochemical cell, at which the photocurrent is zero. The slope of the onset potential versus temperature plot is approximately equal to $$\frac{\delta V_{FB}}{\delta T}.$$

Thus, having determined the slope, $\text{pH}_{pzc}$ can be computed by the use of equation (5).

The invention uses a standard three-electrode photoelectrochemical cell 11, as shown in FIG. 1. The semiconductor, for which the $\text{pH}_{pzc}$ is to be determined, is used as the working electrode 12 for the cell 11. The counter electrode 13 is a high surface area platinum electrode and the reference electrode 14 is a reversible hydrogen electrode (RHE). The electrolyte 15, in which electrodes 12, 13, and 14 are immersed, can be an aqueous electrolyte or nonaqueous electrolyte and is supplied to cell 11 through tube 16. A water bath 17 and a heater 18 are used to control the temperature of the photoelectrochemical cell 11. A light source 19 (typically a 100-watt xenon bulb) and a light chopper 25 are used to illuminate the semiconductor 12 through an opening 20. A thermometer 21 is used to measure the temperature of the electrolyte 15. A variable potential source 22 and an ammeter 23 are connected in series between electrodes 12 and 13. A high impedance voltmeter 24 is connected between electrodes 12 and 14.

In the operation of this invention, the semiconductor material to be tested is used as electrode 12 is subjected to chopped light from light source 19 and light chopper 25. The temperature of the cell 11 is varied by means of heater 18. Each time a reading is taken by the thermometer 21, potential source 22 is varied until ammeter 23 reads zero current. Then the onset potential is read on voltmeter 24.

Figure 2:
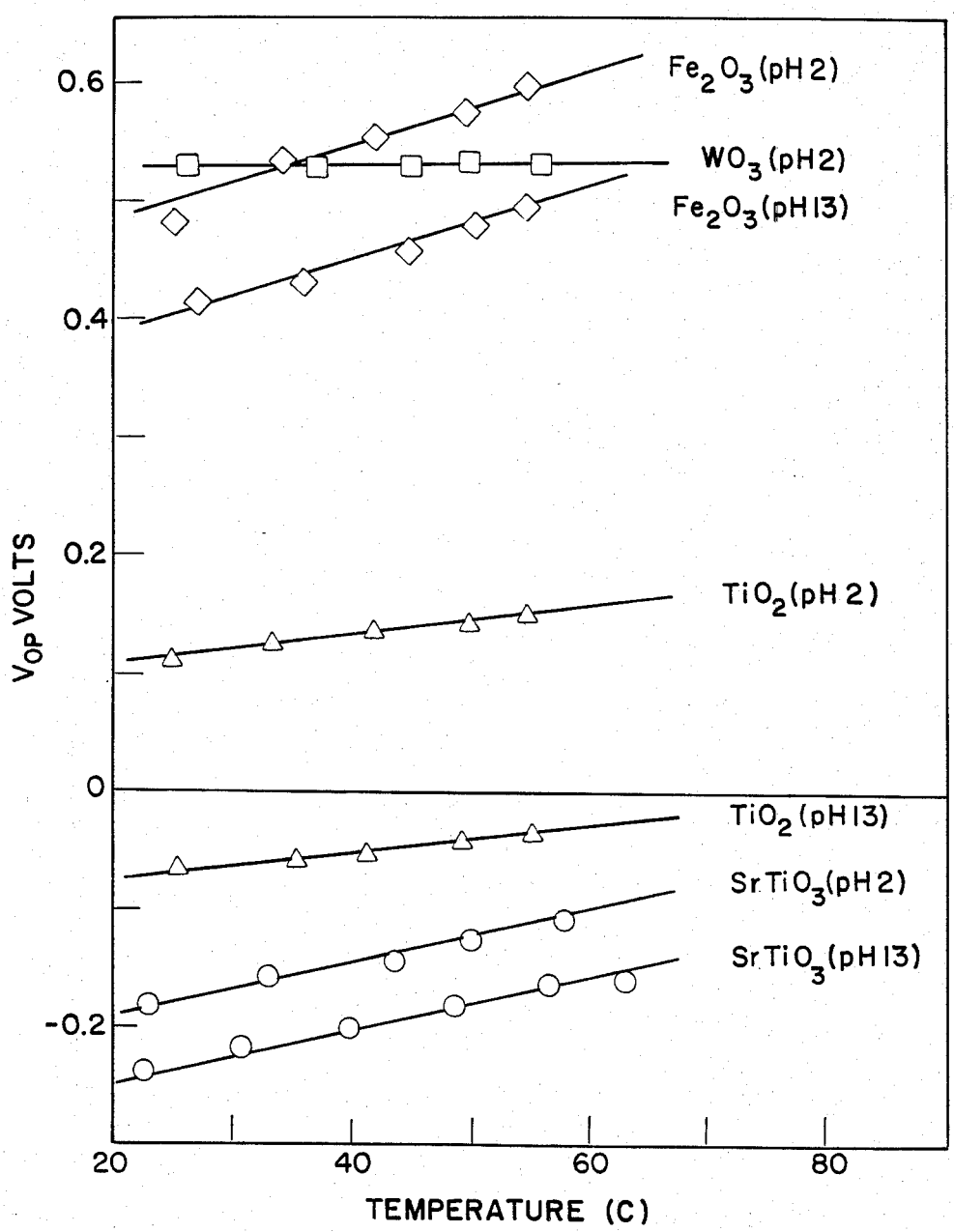
FIG. 2 is a graph of onset potential versus temperature for several semiconductor materials at different pH values.

The $\text{pH}_{pzc}$ of four different n-type metal oxide semiconductors was determined by this method. The temperature dependence of the onset potential for $WO_3$, $\alpha\text{—}Fe_2O_3$, $TiO_2$, and $SrTiO_3$ between 20° C. and 60° C. is shown in FIG. 2. Using the slope as determined from FIG. 2 the $\text{pH}_{pzc}$ is determined for each of the semiconductors using equation (5). The results are given in Table 1 below and are compared with the values of $\text{pH}_{pzc}$ given in the literature for these semiconductors. The differences noted between literature values and values obtained by the method described above are relatively small, and may be attributed to the very different configuration of the semiconductor sample (i.e., powder versus a single large surface).

TABLE I

| Electrode | pH (25° C.) | Slope (mV/deg) | n cm$^{-3}$ | $N_c$ (cm$^{-3}$) | $\text{pH}_{pzc}$ | $\text{pH}_{pzc}$ (Average) | $\text{pH}_{pzc}$ (Literature) |
|---|---|---|---|---|---|---|---|
| $\alpha\text{-}Fe_2O_3$ | 2 | 2.9 | $5.1 \times 10^{17}$ | $2.4 \times 10^{22}$ | 9.8 | 9.3 | 8.8, 8.6 |
|  | 13 | 2.7 |  |  | 9.8 |  |  |
| $SrTiO_3$ | 2 | 2.25 | $3.2 \times 10^{17}$ | $6.8 \times 10^{19}$ | 8.9 | 9.3 | 8.6 |
|  | 13 | 2.4 |  |  | 9.7 |  |  |
| $TiO_2$ | 2 | 1.15 | $6.2 \times 10^{19}$ | $3.0 \times 10^{21}$ | 4.1 | 5.0 | 5.8 |
|  | 13 | 1.5 |  |  | 5.8 |  |  |
| $WO_3$ | 2 | 0.1 | $7.6 \times 10^{19}$ | $9.8 \times 10^{18}$ | 0.5 | 0.5 | 0.43 |

The advantages of this invention are that it provides an easy, inexpensive and effective method to measure the potential of zero charge ($\text{pH}_{pzc}$) for single crystal or polycrystalline semiconductor electrodes. This method is capable of determining this important parameter without the need for powdering the material, thus eliminating uncertainties attributable to sample configuration.

What is claimed is:

1. A method for obtaining the onset potentials at different temperatures of a semiconductor material comprising the steps of:

using the semiconductor material as the working electrode of a three-electrode photoelectrochemical cell including a counter electrode, a reference electrode, an electrolyte, a heater for controlling the temperature of the photoelectrochemical cell, and a light source for illuminating the working electrode;

measuring the temperature of said electrolyte at several different temperature levels;

for each temperature level measured, varying the potential between said working electrode and said counter electrode until there is zero current between the working electrode and the counter electrode; and measuring the potential between said working electrode and said reference electrode whereby the measured potential is the onset potential corresponding to the measured temperature.

2. A method according to claim 1 including the step of determining the slope of a graph of measured onset potentials versus measured temperatures.

3. A method according to claim 2 including the step of using said slope to compute pH$_{pzc}$ of the semiconductor material by substituting the slope for the term $$\frac{\partial V_{FB}}{\partial T}$$

in the equation:

$$\frac{\partial V_{FB}}{\partial T} = \frac{2.3R}{F}\left(\text{pH}_{pzc} - \log_{10}\frac{n}{N_c}\right)$$

and computing pH$_{pzc}$ where V$_{FB}$ is the flatband potential of the semiconductor material, T is the temperature of the cell, n is the free carrier density, N$_c$ is the density of states in the conduction band, R is the universal gas constant and F is Faraday's constant.

4. A method according to claim 1 wherein said counter electrode is a high surface area platinum electrode and said reference electrode is a reversible hydrogen electrode.

* * * * *